(12) United States Patent
Hofmeister

(10) Patent No.: US 6,994,894 B2
(45) Date of Patent: Feb. 7, 2006

(54) METHOD AND SYSTEM FOR THICK-FILM DEPOSITION OF CERAMIC MATERIALS

(75) Inventor: William Hofmeister, Nashville, TN (US)

(73) Assignee: Vanderbilt University, Nashville, TN (US)

(*) Notice: Subject to any disclaimer, the term of this patent is extended or adjusted under 35 U.S.C. 154(b) by 124 days.

(21) Appl. No.: 09/958,705

(22) PCT Filed: Apr. 20, 2001

(86) PCT No.: PCT/US01/12952

§ 371 (c)(1),
(2), (4) Date: Oct. 9, 2001

(87) PCT Pub. No.: WO01/81648

PCT Pub. Date: Nov. 1, 2001

(65) Prior Publication Data

US 2002/0164432 A1   Nov. 7, 2002

Related U.S. Application Data

(60) Provisional application No. 60/198,678, filed on Apr. 20, 2000.

(51) Int. Cl.
   *C23C 14/30*  (2006.01)
   *C23C 14/28*  (2006.01)
   *C23C 8/00*   (2006.01)
(52) U.S. Cl. .................... 427/596; 427/595; 427/586
(58) Field of Classification Search ............... 427/457, 427/561, 581, 595, 596, 446, 449, 453, 586
See application file for complete search history.

(56) References Cited

U.S. PATENT DOCUMENTS

| | | | |
|---|---|---|---|
| 4,947,463 A * | 8/1990 | Matsuda et al. ....... | 219/121.85 |
| 4,958,058 A | 9/1990 | Scheidt et al. ........... | 219/121.6 |
| 5,162,969 A | 11/1992 | Leung ......................... | 361/225 |
| 5,229,171 A | 7/1993 | Donovan et al. ............ | 427/483 |
| 5,344,676 A | 9/1994 | Kim et al. .................. | 427/468 |
| 5,718,863 A * | 2/1998 | McHugh et al. ............ | 264/309 |
| 5,847,357 A | 12/1998 | Woodmansee et al. | 219/121.65 |
| 5,869,432 A * | 2/1999 | Aksay et al. ................ | 505/450 |
| 6,143,378 A * | 11/2000 | Harwell et al. ............. | 427/597 |
| 6,251,488 B1 * | 6/2001 | Miller et al. ................ | 427/596 |
| 6,258,417 B1 * | 7/2001 | Goswami et al. ........... | 427/452 |
| 6,449,038 B1 * | 9/2002 | Stolze ......................... | 356/316 |
| 2002/0192479 A1 * | 12/2002 | Goswami et al. ........... | 428/469 |

* cited by examiner

*Primary Examiner*—Timothy Meeks
*Assistant Examiner*—Eric B. Fuller
(74) *Attorney, Agent, or Firm*—Waddey & Patterson, P.C.; Larry W. Brantley; Howard H. Bayless

(57) ABSTRACT

A method of depositing a solid film on a substrate in which a stream comprising particles suspended in a transport gas is moved through a heating zone. The particles are combined with the transport gas from a powder feeder operatively coupled to a gas flow tube. The particle stream is directed toward the heating zone by ejecting the powder stream from a nozzle connected to a distal end of the gas flow tube. A radiation source is directed at the suspended particles as they move through the heating zone so that the particles heated to a molten state. The droplets are undercooled in a cooling zone before impact with the substrate.

34 Claims, 12 Drawing Sheets

METHOD AND SYSTEM FOR THICK-FILM DEPOSITION OF CERAMIC MATERIALS

This application claims the benefit of Provisional application Ser. No. 60/198,678, filed Apr. 20, 2000.

TECHNICAL FIELD

A portion of the disclosure of this patent document contains material that is subject to copyright protection. The copyright owner has no objection to the facsimile reproduction by anyone of the patent document or the patent disclosure, as it appears in the Patent and Trademark office patent file or records, but otherwise reserves all copyright rights whatsoever.

The present invention relates generally to the growth of ceramic films on a substrate using free-form deposition. More particularly, this invention pertains to the formation of ceramic thick-films on a substrate using undercooled ceramic particles.

BACKGROUND ART

Rapid prototyping using stereo lithography and plastic materials has enjoyed great commercial success. The natural extension of this process to metallic and ceramic materials has been tried using free form deposition techniques. Solid free form fabrication of metallic materials is being developed at several laboratories. One of these techniques is an extension of selective laser sintering (SLS) known as laser engineered net shaping (LENS). Instead of bonding material in a bed of powder, the powder is delivered in a gas jet through nozzles into the focus of a Nd:YAG laser to form a molten pool. The part is then driven on an X/Y stage to generate a three-dimensional part by layer wise, additive processing. Solidification of the molten pool forms a fully dense, free standing deposit.

Free form fabrication of ceramic materials is considerably more difficult. In general, the ceramics considered here are ionic bonded combinations of a metal and oxygen ($Al_2O_3$, $ZrO_2$, $Y_2O_3$). Ceramic powders cannot be processed in a LENS type system for several reasons. The thermal conductivity is too low to provide an adequate heat sink for the laser beam. The gradients generated in the workpiece are simply too high to allow solidification without cracking these thermal shock sensitive materials. Oxide ceramics must maintain stoichiometry for proper crystal growth. Ceramics lose oxygen when melted, so that a molten pool of appreciable size and duration will certainly result in an oxygen deficient structure. Alumina and zirconia are polymorphic and, on cooling, can be cracked by solid-state phase transformations.

Fabrication of ceramic films using 3D printing/robocasting slurries has also been attempted. However, these methods produce green-state objects that must be fired or heat treated before use that results in dimensional changes for the final product. Other experiments have been conducted using direct fusion of ceramic powder by laser energy in processes analogous to the LENS process. These processes have shown limited success because it is difficult to control the heat transfer from the molten zone, thermal stresses, the phases formed by solidification, and subsequent solid state transformations in the object.

For the past decade, the inventor has been engaged in the study of nucleation and solidification kinetics. Specifically, the functional relationships between supercooling and solidification velocity in a variety of metallic systems, and the role of solute and fluid flow on nucleation kinetics have been examined. The role of supercooling on phase selection and solidification kinetics has been well studied in metallic systems. However, the understanding of these phenomena in high temperature oxide systems lags behind metallics. This is not surprising given the present methods of fabrication of the two classes of materials. Most metallic alloys are formed from the melt by casting or atomization. With the exception of glasses, few ceramics are processed from the melt.

In the study of metallic materials, manipulation of the nucleating phase through supercooling is well established. Studies of the TiAl and NbSi systems revealed that phases formed by peritectic reaction can be nucleated directly from the supercooled melt. The same should be true in the high temperature oxide superconductors (HTSC). The desired superconducting phase $YBa_2Cu_3O_{7-\square}$(Y-123) forms by two peritectic reactions: liquid+$Y_2O_3\square Y_2BaCuO_x$(Y-211) and liquid+Y-211$\square$Y-123. The temperature difference between the high temperature liquids and the Y-123 peritectic phase is 600K. Oxide melts are generally glass formers, so this degree of undercooling can be achieved. In experiments using the aero-acoustic levitator on 2–3 mm diameter samples of Y-123, the tetragonal Y-123 phase was formed directly from the melt. This discovery resulted in a continuing study of the high temperature phase relations and alternate processing strategies for oxide superconductors.

What is needed, then, is a system and method for depositing ceramic and other solid films on a substrate that creates a film that is structurally and dimensionally stable, that does not require post-deposition heat-treating of the film, and that is not subject to extreme process control requirements.

This application outlines an approach to develop thick film deposition of ceramic materials. The key concept is the deposition of supercooled ceramic particles on a substrate. The heating source will be optical and not directed at the substrate. Supercooled particles contain less sensible heat and therefore reduce the heat load on the substrate, minimizing thermal shock. The viscosity of liquid ceramics increases exponentially with supercooling. The solidification velocity increases with supercooling as well. These two factors improve the probability that droplet impacts will spread evenly and solidify quickly. The degree of supercooling has some influence on phase selection. The hypothesis is that fully dense, thick films of ceramic materials can be made by careful control of droplet temperature, size, and velocity.

DISCLOSURE OF THE INVENTION

The direct ceramic fabrication method of this invention can be used to: fabricate ceramic parts for use in material processing and handling; create thick films of high temperature superconductors; create thermal barrier coatings; fabricate precision electronic parts and packaging; and hermetically seal biomedical devices such as implantable electronics, prosthetics, and drug pumps. The process also allows rapid prototyping and small-scale production of ceramic objects. This process will make fully-dense objects from the melt, bypassing the traditional sintering of green ceramic/binder materials. Objects built using this process can have geometries impossible to achieve by machining or molding processes. The process of this invention can also be used to join ceramic items to other ceramic items or metals, e.g., to hermetically seal ceramic pacemaker cases.

The method and system of this invention can be used with metallic or semiconductor particles, and metallic or semiconductor phases, in the same manner as ceramic particles.

Figure 15B:
Figure 15A:
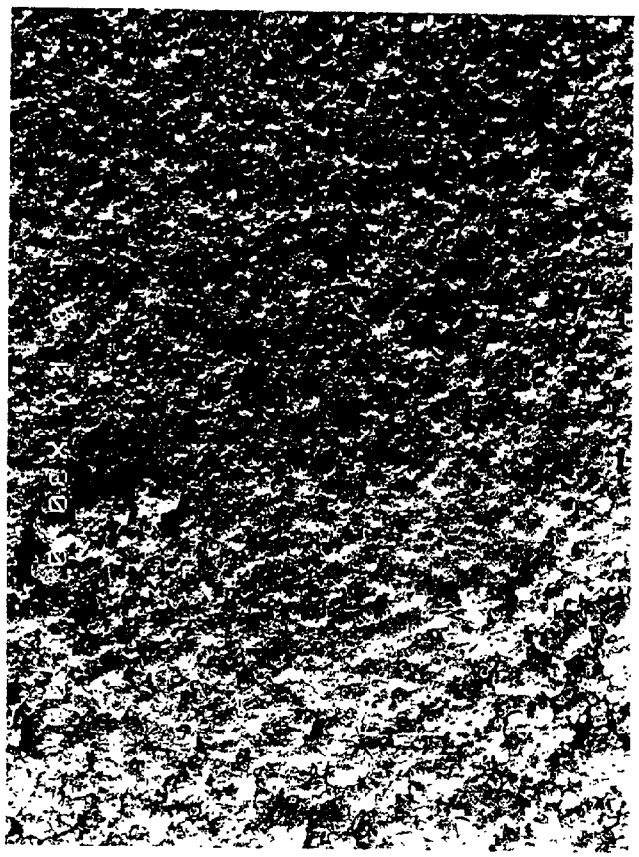

FIGS. 15(a) and 15(b) are SEM micrographs showing deposition of a high temperature superconductor $Y_{0.3}Nd_{0.7}Ba_2Cu_3O_{7-x}$.

Figure 16:
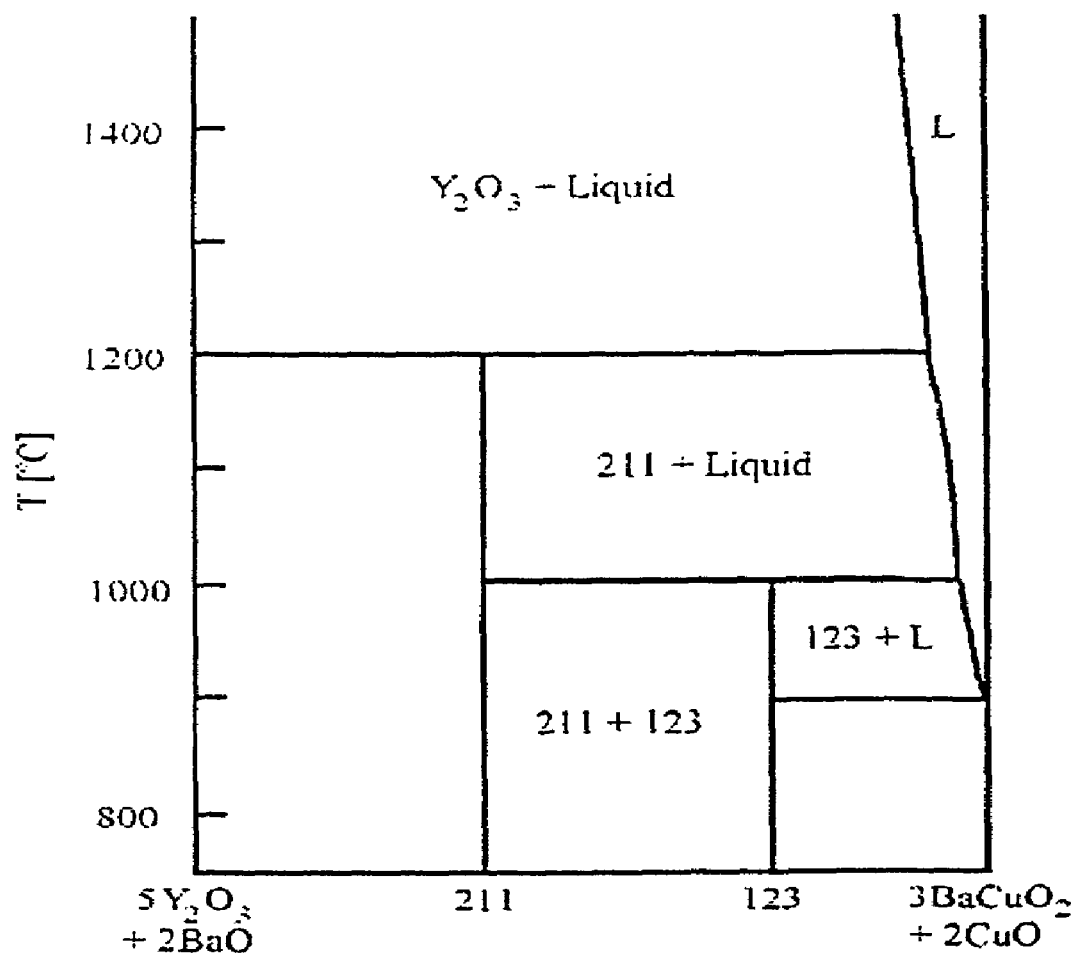

FIG. 16 is a phase diagram showing phase selection during undercooling of particle droplets in accordance with the method of this invention.

BEST MODE FOR CARRYING OUT THE INVENTION

The method of this invention relies generally on novel process steps that are combined to solve the principal problems with existing techniques. These innovations include a powder nozzle that can focus a gas-entrained powder into a narrow stream with very low divergence. The system and method further include a high flux optical radiation source that can melt ceramic and other particles while in flight thereby decoupling the heat source from the substrate and part, mitigating problems with heat transfer. Another step uses gas cooling to precisely undercool molten ceramic particles while in flight to obtain ceramic phase selection from the melt. For example, in Y123 high temperature oxide superconductors it is possible to bypass two peritectic reactions (involving undesirable $Y_2O_3$ and 211 phases) and solidify the 123 crystal structure directly from the undercooled melt. In combination, these innovations allow direction of a thin stream of ceramic material that will rapidly solidify to a desired phase upon impact.

System and Method Overview

Figure 14:
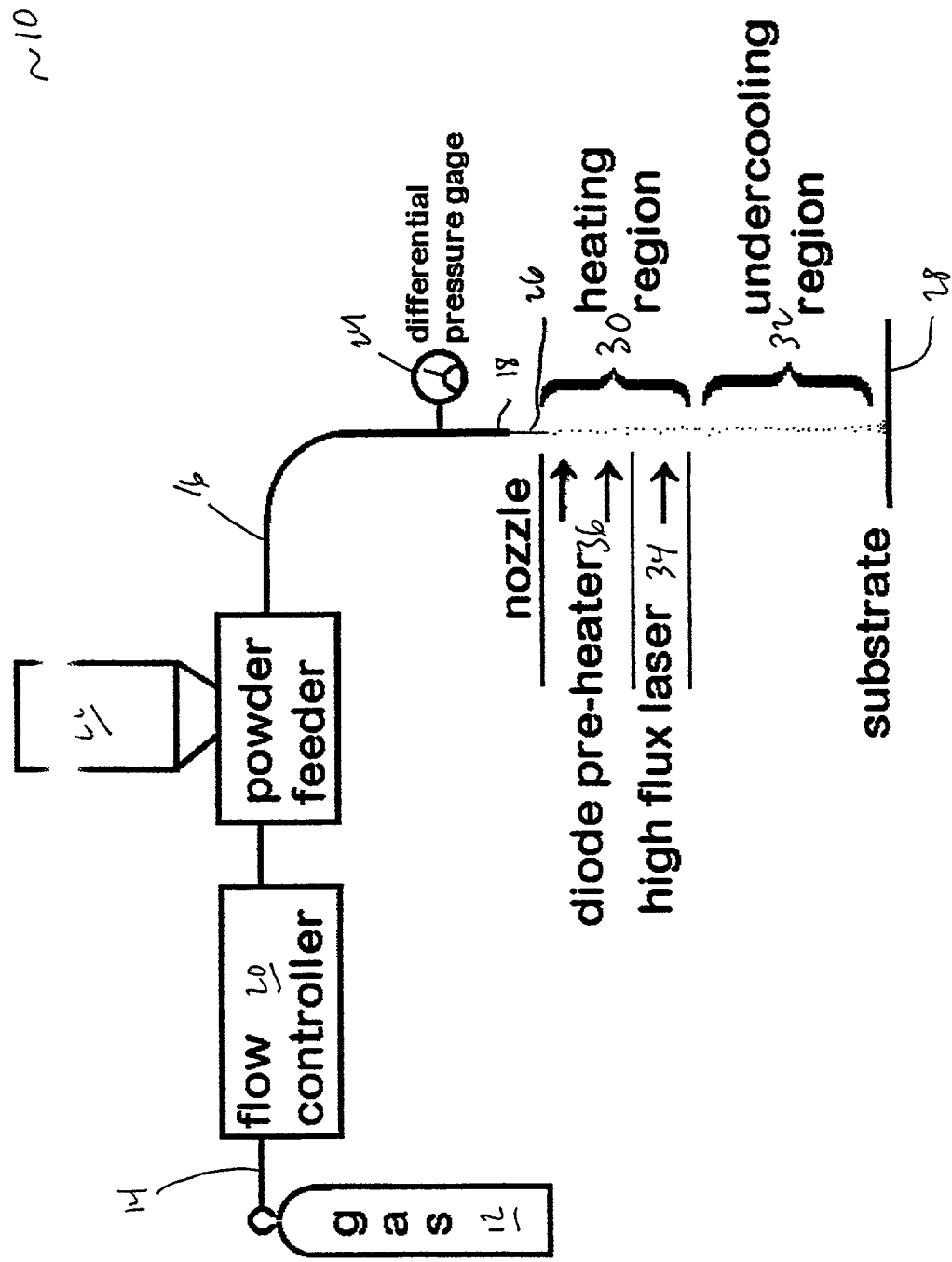
FIG. 14 is a block diagram of one embodiment of the deposition system of this invention.

The general layout of a system 10 that can implement the method of this invention is shown in FIG. 14. A source 12 of transport gas such as argon or, preferably, oxygen is coupled to a proximal end 14 of a gas flow tube 16. A conventional gas flow controller 20 is used to adjust the transport gas flow rate as discussed in more detail below. A powder feeder 22 is also coupled to the flow tube 16 so that particles of the material to be deposited are combined with the moving transport gas to form a particle stream within the tube 16. The powder feeder 22 can be a conventional powder feeder device such as made by Optimec. A differential pressure gauge 24 monitors the particle stream pressure.

A nozzle 26 is connected to a distal end 18 of the gas flow tube to direct the particle stream towards a substrate 28. Preferably, nozzle 26 is a laminar flow nozzle that inhibits convergence and divergence of the particle stream as it leaves the flow tube. In addition, a preferred embodiment of the system 10 will include a means to create an annular co-flow of transport gas around the particle stream as it leaves the nozzle to constrain the stream as it moves toward the substrate 28. Such a co-flow can be created by positioning the primary nozzle 26 concentrically within an annular co-flow nozzle (not shown) from which transport gas is caused to move at the same velocity as the particle stream.

After the particle stream is ejected from the primary nozzle 26, it passes through a heating zone 30 and then through a cooling zone 32. An optical radiation source 34, preferably a high flux laser operating at or near a wavelength of 10 microns, emits an energy beam towards the heating zone 30. The radiation source is selected and operated to generate a power density within in the heating zone that will completely melt the suspended particles as they pass through. Preferably, the particles are heated to a temperature that is just below the vaporization threshold of the material from which the particles are formed. This will insure that the particles, which enter the heating zone 30 in the solid phase, are transformed into fully molten droplets. As described in more detail below, the power density needed to achieve this fully molten condition will depend on a number of factors, such as the size, shape, and chemistry of the particles, the temperature of the transport gas and particles before entering the heating zone 30, and the flow rate of the particles through the heating zone. In a preferred embodiment, ceramic particles having a nominal diameter in the range of 30–50 microns can be suspended in a transport gas having a velocity of 8 20 meters/second. The size, shape, and chemistry of the particles should be selected for maximum absorption of the radiant energy.

Rapid and efficient heating of the particles can be aided by preheating the transport gas to a temperature of 300° C. and/or by passing the particle stream through a pre-heater 36 that is positioned between the nozzle 26 and the energy beam generated by the radiation source 34 and preheating the particles to a temperature of approximately 700° C.

Figure 2:
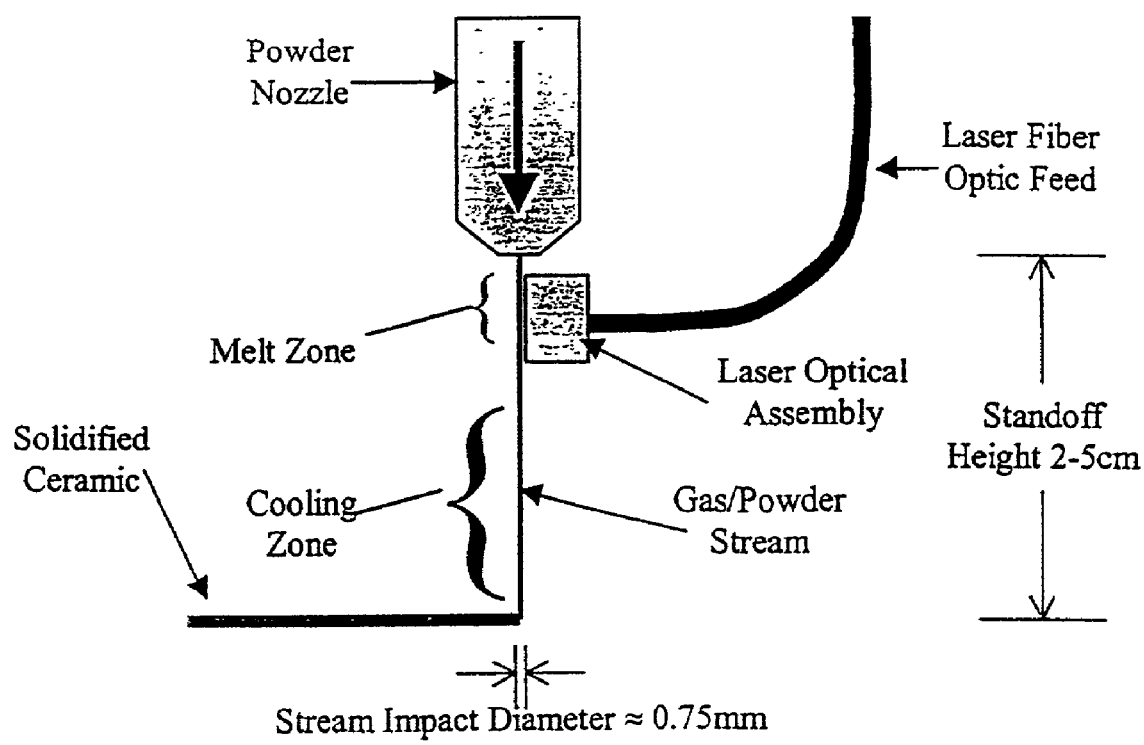
FIG. 2 is a block and schematic diagram of one embodiment of the system of this invention.

The particle stream, now containing droplets of the material suspended in the transport gas, passes through a cooling zone 32 before impact with substrate 28. The suspended droplets are cooled by convection and radiation as they move through cooling zone 32 and by conduction upon contact with the substrate 28. The objective of the method and system is to undercool the droplets so that when they impact the substrate 28, they go directly from a liquid phase to a 1:2:3 solid phase, bypassing undesirable high temperature phases. Thus, the droplets must be cooled below their equilibrium melting temperature to achieve a metastable state of an undercooled liquid. Again as will be discussed in more detail below, the cooling zone 34 parameters will depend on factors such as the transport distance between the heating zone 30 and the substrate 28, the temperature of the transport gas, the particle velocity, and the temperature of the substrate 28. In a preferred embodiment of the system 10, the undercooling process is aided by preheating the substrate 28 to a temperature as high as 700° C. As shown in FIG. 2, a total transport distance of 2–5 cm from heating zone to the substrate can allow sufficient cooling of the droplets.

Powder Heating and Melting

Figure 8:
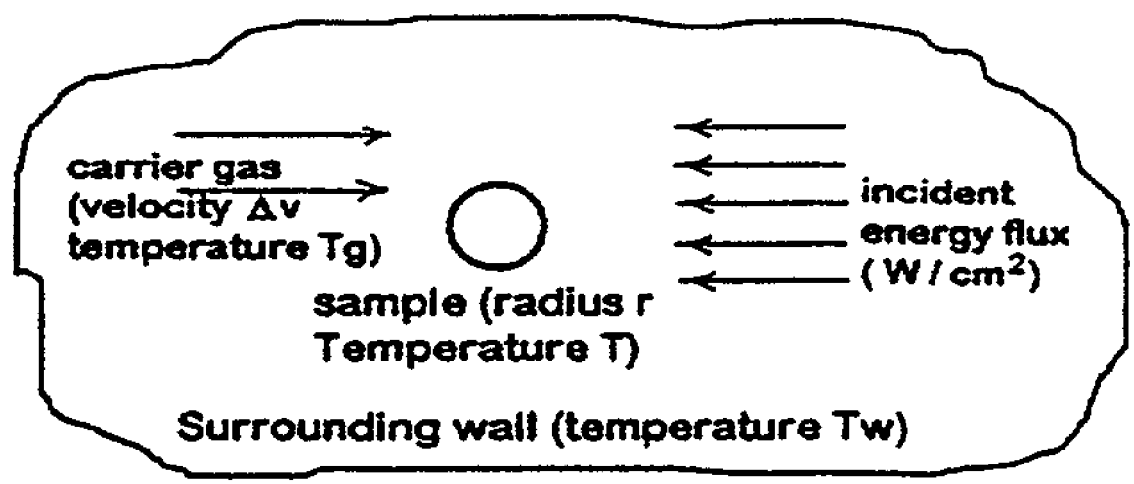
FIG. 8 is a schematic illustrating the problem of steady-state heat balance as a factor of transport gas velocity and temperature, particle size and temperature, and surrounding wall temperature, and incident energy flux.

The ceramic and other powders used in the present method will typically be less than 100 microns in diameter. To achieve the undercooling phase required, the powder must be fully molten. The heating method is essentially radiation heating, while the drops cool by radiation, forced convection, buoyant convection, and conduction. Because of the small particle size, the total energy necessary to melt these powders is small. However, the extreme melting temperatures pose a challenge. It is useful to consider the steady state problem and make some approximations of the incident energy flux necessary to maintain a superheated droplet. A schematic of the problem is shown in FIG. 8. A particle of radius r and temperature T is being heated by an optical source with an incident energy flux measured in Watts/cm². Since powders will be in a transport gas stream, the relative transport gas velocity is given as $\Delta v$ and the gas temperature as $T_g$. The process is conducted in an enclosure with a wall temperature $T_w$. In the steady state problem, the heat in and out of the sample is independent of the sample specific heat, and can be written:

$$\text{heat input} = \frac{\alpha Q_{laser}}{\text{beam area}} \times \pi r^2$$

where $\alpha$ is the absorptivity of the sample, $Q_{laser}$ is the total laser power, and $\pi r^2$ is the cross sectional area of the drop. The heat out from radiation and convection can be written as:

$$\text{heat output} = \epsilon A \sigma (T^4 - T_w^4) + h A (T - T_g)$$

where $\alpha$ is the total hemispherical emissivity, A is the surface area of the drop, and h is the convective heat transfer coefficient. If the relative gas velocity, $\Delta v$, is less than 5 ms⁻¹, and the radius is small, say 10 microns, then the Reynolds number is small and the Nusselt number (Nu=2 hr/$k_g$, where $k_g$ is the thermal conductivity of the gas) approaches two. Consequently, as a first approximation, we can ignore forced convection and consider only conduction through the gas. For opaque substances the total emissivity is equal to the absorptivity. Equating the heat input and output, substituting and rearranging gives the following:

$$\text{Incident flux} = \frac{Q_{laser}}{\text{beam area}} = 4\sigma(T^4 - T_w^4) + \frac{4k_g}{r\alpha}(T - T_g)$$

The sample superheat temperatures are high. At 2700K, for example, the first term on the right hand side swamps the second term for a wall temperatures somewhat cooler than the sample. The balance is weakly dependent on sample size and strongly depends on the temperature of the surrounding wall. For a wall temperature of 300 K, an incident flux of 1200 W/cm² is necessary to maintain 2700K. Maintaining 3400 K requires 3000 W/cm². Fortunately, the specific heat of the samples is small so that when subjected to this incident flux, melting is accomplished in a few hundredths of a second. This analysis also shows that it is probably not necessary to heat the gas to assist the process. Low gas temperatures are desirable to reduce the heat load on the substrate.

It is apparent from the above discussion that the high incident flux necessary for melting requires a high power laser source. Other sources of optical heating besides lasers can be used to heat ceramic powders. Consider that the powders will be flowing in a cylindrical tube. This tube can be constructed as a "hohlraum" such that all the incident flux is totally reflected inside the tube. Laser diodes are available that can output 50 W of power in a beam 1.12 cm long and less than a millimeter wide. For a cylinder segment of 1 cm with a radius of 0.5 cm, the interior of the cylinder segment will have an incident flux of 45 W cm⁻². This flux is equivalent to a sample temperature of about 1700 K in vacuum. From the steady state heat balance above, the smaller the powders, the lower the equilibrium temperature in an image furnace. By reducing the surface area of this cavity, samples can be preheated to 700–1000K in oxygen gas.

Figure 13:
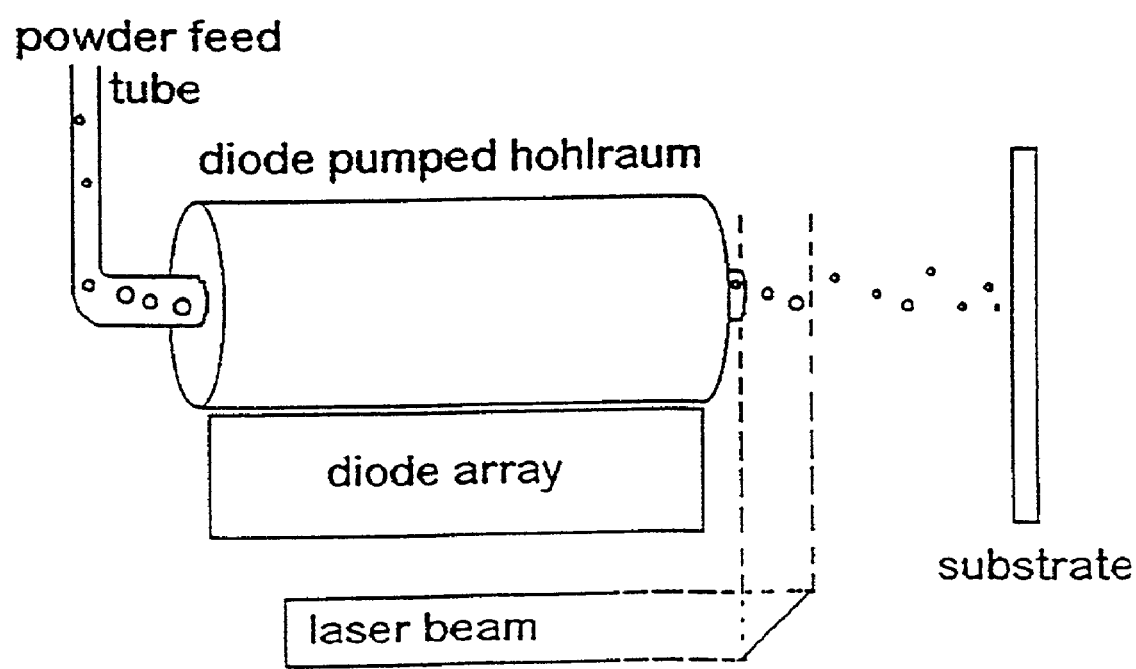
FIG. 13 is a block/schematic diagram of one embodiment of a powder heating system.

The method for particle heating can be summarized by reference to FIG. 13. Powders are preheated in a radiant furnace powered by diodes and melted in the laser heating zone by a high incident flux.

Droplet Cooling

Figure 11:
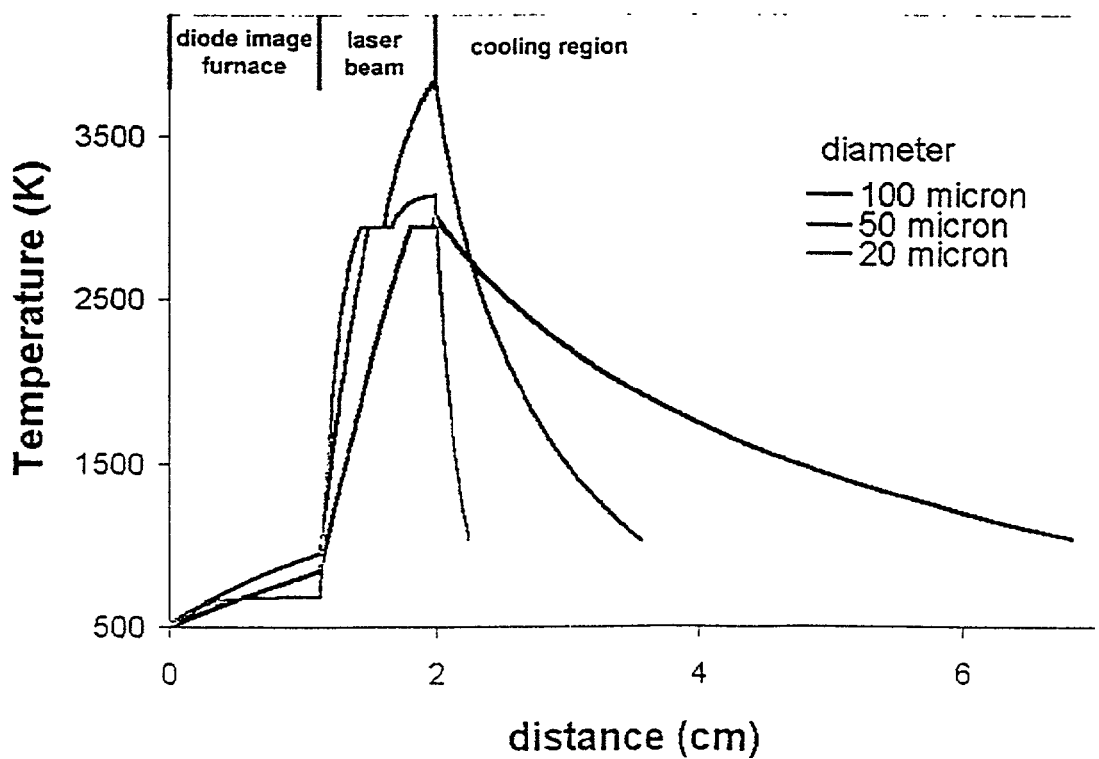
FIG. 11 is a graph of temperature vs. distance for three powder diameters as the particles pass through a preheating furnace and laser energy source in the heating zone and through the cooling zone, using the heating apparatus of FIG. 13.

Droplet cooling is more sensitive to particle size than particle heating. Since precise control of particle impact temperature is essential to successful processing, it is important to understand the effects of particle size in heating and cooling. Therefore, a simulation strategy must be developed, and these simulations tuned with controlled experiments. Simple Newtonian calculations of particle heating and cooling were run for zirconia. Time vs. temperature curves were calculated for sample diameters from 20 to 100 microns in a powder heating and cooling simulator. The initial powder temperature was 500K. The powders were transported in oxygen gas at a velocity of one meter per second through a 1.12 cm long diode pumped image furnace and then exposed to a 480 W laser beam 0.88 cm long and 0.1 cm wide. The relative powder/gas velocity ($\Delta v$) was 5 cm s⁻¹. Three distance vs. temperature curves are shown in FIG. 11. The calculations show the interplay between conductive cooling and radiative heating in the diode image furnace (36 on FIG. 14). The smallest particle has the lowest temperature as it exits the diode image furnace as suggested by the steady state calculation.

Figure 9:
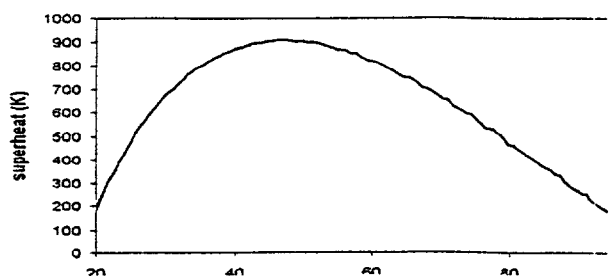
FIG. 9 is a graph of the superheat reached by particles as a function of particle diameter under a given set of heating conditions.
Figure 10:
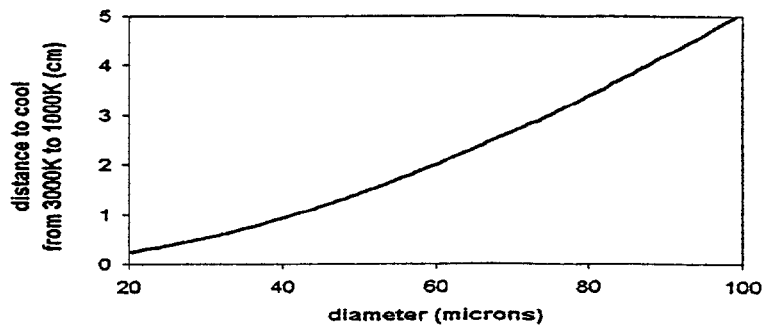
FIG. 10 is a graph showing the relationship between the distance required for a particle/droplet to cool from a liquid temperature of 3000K to 1000K as a function of particle diameter.

The larger particles do not reach steady state in the 11 ms residence time in the image furnace. Were this region longer, the 100 micron particle would reach the highest temperature. Because of the volume to surface area interplay in the simulation, there is a maximum superheat as a function of diameter. In FIG. 9, the particle superheat is plotted as a function of particle diameter. The critical area to note in the simulation is the cooling curve. Drop enthalpy scales with $r^3$ and heat loss scales with $r^2$. As a result, smaller particles cool quite quickly, and the limiting size will be dependent on the shortest reasonable working distance. Calculations of the distance required to cool particles from a liquid temperature of 3000K to 1000K are shown in FIG. 10. For the larger particle diameters, the cooling distance is sufficient to deliver undercooled particles to the substrate.

For convection cooling:

$$q(\text{dot})=h*A*(T-To)0$$

Heating the gas provides a higher To and reduces the convective heat loss. This helps to melt the particle (less laser energy is needed for heating) and the particle stay molten longer over the distance of flight, i.e. increases the working distance. The distance of exposure from the heating beam to the substrate 28 must be designed for each material and process condition to achieve the proper undercooling on contact with the substrate. This distance could be 0.25 cm to 5 cm.

Droplet Impact

Figure 12:
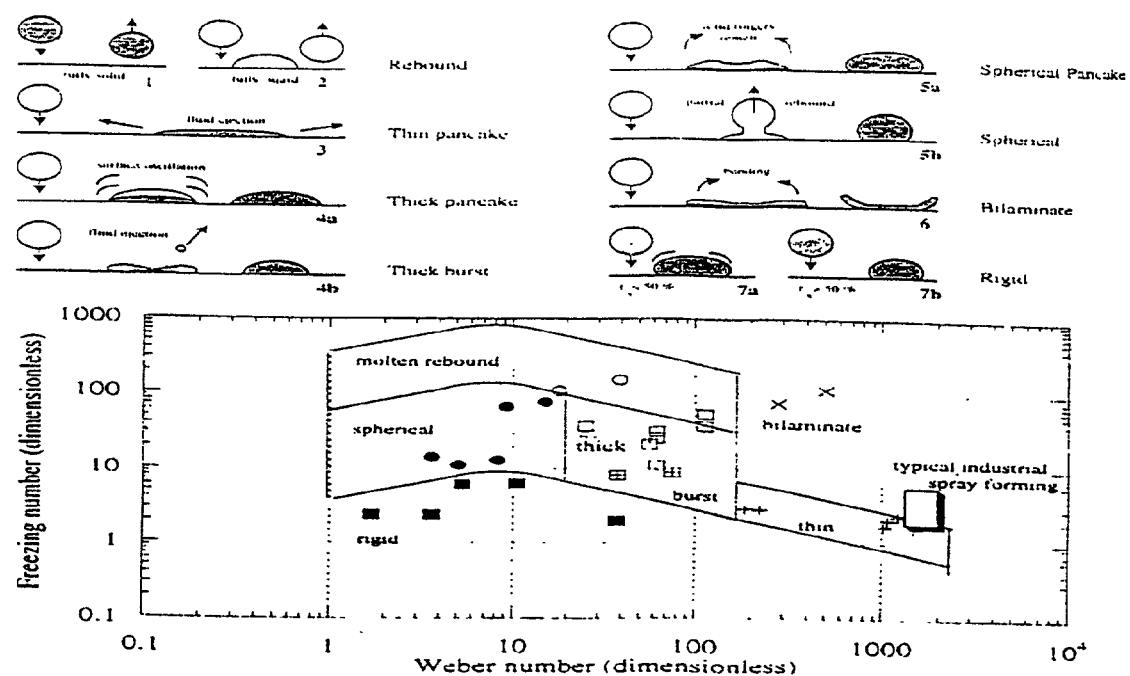
FIG. 12 illustrates examples of splat morphology associated with impact of droplets on a substrate, mapped with Weber number and dimensionless freezing number.

The physics of droplet impacts has been well studied. Recently, the development of direct metal deposition and solid freeform fabrication has contributed to this body of knowledge. A fully dense deposit will depend on the ability to select the proper spreading and solidification behavior for the droplets. A useful guideline for this work can be found in the empirically derived impingement map of Matson, et. al. Two figures from that work are reproduced here in FIG. 12. The Weber numbers calculated for ceramic impacts range from 20–200, just to the left of the spray forming processes. The dimensionless freezing number (as well as the Weber number) can be adjusted by the processing conditions. The key is to design the splat process to achieve the thick pancake structure shown in FIG. 12. Fluid ejection is undesirable. In experiments on drop impacts, ultra high speed thermal imaging was used to record the splat interface temperature for nickel and zirconium-based metallic glass forming drops. As expected, the morphology of the splats changed with the temperature at impact. Superheated nickel drops formed tin pancakes with significant liquid ejection. Undercooled nickel splats formed thick pancakes. All the metallic glass alloys formed thick pancakes with little fluid ejection. This is a result of the increase in viscosity with undercooling that is characteristic of glass forming alloys. Ceramic materials have a strong change in viscosity with undercooling, which enhances the ability to form thick splat morphologies with little fluid ejection. The temperature and velocity of the droplets can be adjusted to obtain the desired splat morphology.

Droplet Solidification

As stated previously, the science of solidification of undercooled ceramic materials at high undercooling is not well studied. More simply, there is no great body of experience with these materials to guide the prediction of microstructural development from the undercooled melt. Ceramics possess a high entropy of fusion and the pure ceramics tend to exhibit faceted dendritic growth at high undercooling. When $Y_2O_3$ nucleates as the primary phases in HTSC melts, this phase grows as thin, needle-like dendrites. However, the solidification velocity of these dendrites is considerably less than that of cubic metallic dendrites. Primary dendrites of $Nd_2O_3$ have much lower aspect rations and faceted secondary branches. The solidification velocity of the 123 phase grown from the undercooled melt is comparable to a metallic coupled eutectic.

To successfully form a 100% dense deposit, it may be necessary to use some mixtures of ceramic phases to mitigate shrinkage porosity created by highly faceted primary phases. Low melting phases and fluxes are commonly used to aid sintering of ceramics. Some eutectic mixtures may have an advantage in bonding to the substrate and in the density of the deposit.

A pseudo binary cut through the $Y_2O_3$, CuO, BaO pseudo ternary phase diagram is shown in FIG. 16. The process must melt particles of 123 composition, raising their temperature above the extension of the Liquid→Liquid+$Y_2O_3$ liquidus line (~1800 C) at the 123 composition so that they are fully molten. Equilibrium solidification would proceed as follows

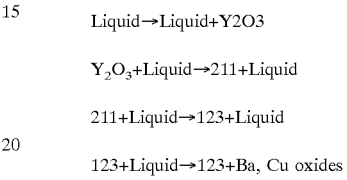

By undercooling the liquid in accordance with the method of this invention, the above reactions can be bypassed. The resulting reaction is:

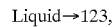

thereby forming the desired phase directly from the melt. Thus, in accordance with one object of the present invention, undesirable high temperature phases (e.g., $Y_2O_3$ and 211) are bypassed.

Experimental Results

Figure 3:
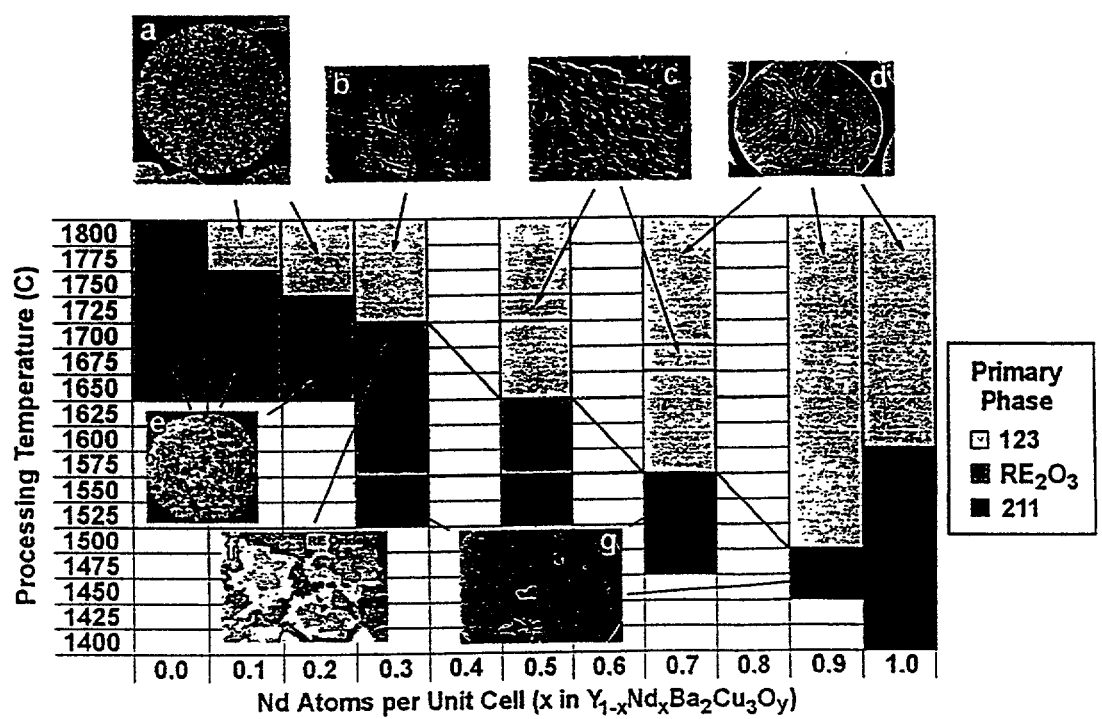
FIG. 3 is microstructural and phase selection map of drop tube experiments on high temperature oxide superconductors performed in pure oxygen.

FIG. 3 shows a microstructural and phase selection map of drop tube experiments on high temperature oxide superconductors performed in pure oxygen. The maximum droplet temperature is the processing temperature. The shaded areas designate the primary phase upon solidification. All samples that were fully molten (light grey regions) formed the 1:2:3 phase on solidification. The micrographs represent typical microstructural features observed in the designated regions as follows: a) fine feathery dendrites of RE-2:1:1 in a eutectic matrix (RE=rare earth, in this case Y,Nd), b) primary RE-1:2:3 with some intergranular 2:2:3, c) dendrites of RE-2:2:3, d) single phase RE-1:2:3, e) primary particles of $RE_2O_3$ in a eutectic matrix, f) large dendrites of $RE_2O_3$ with RE-1:2:3 nucleating on the surfaces of the dendrites, g) primary RE-2:1:1 in a eutectic matrix.

Figure 4:
FIG. 4 shows a microstructure of a powder particle that formed single phase Gd123 following melting, undercooling and solidification in a powder drop tube.

FIG. 4 shows the microstructure of a powder particle that formed single phase Gd123 following melting, undercooling and solidification in a powder drop tube.

Figure 1:
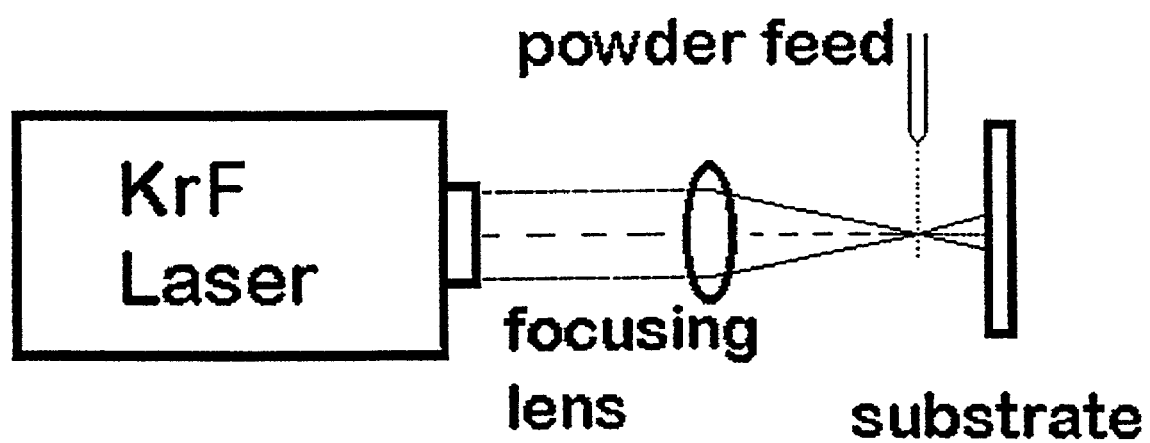
FIG. 1 is a schematic diagram of a laser liquid patterning apparatus.

The processing method of using supercooling to form ceramic thick films of a desired phase on a heat sensitive substrate was tested. Initial deposition of HTSC, $Y_2O_3$ stabilized $ZrO_2$, CeO and $Al_2O_3$ materials has been accomplished. The test method, termed laser liquid patterning, used a pulsed KrF eximer laser with a short focal length lens to melt and accelerate particles to a cold substrate. The test apparatus is shown schematically on FIG. 1.

Figure 5:
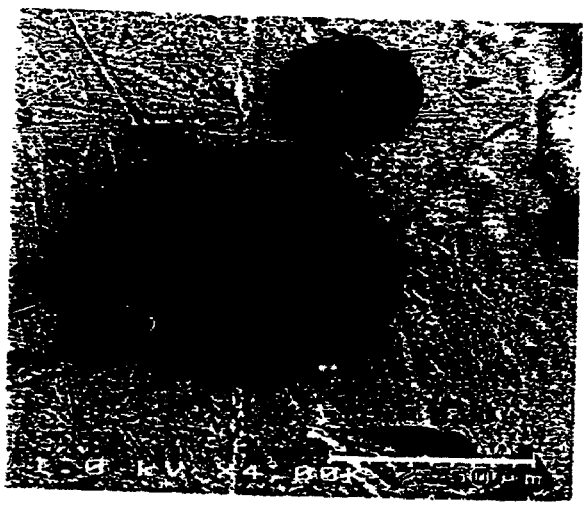
FIG. 5 is a scanning electron micrograph (SEM) of yttria stabilized zirconia splats formed by laser liquid patterning.
Figure 6:
FIG. 6 shows alumina splats formed on a silver substrate by laser liquid patterning.

Powders are fed through the focal point of the laser beam. The short duration, high energy pulses from the laser are used to melt particles and propel them toward the substrate. These molten particles are quenched by the substrate and solidify as small splats. The substrate is positioned well behind the focus of the lens to reduce substrate heating. In these experiments, a silver substrate was used. FIG. 5 is a scanning electron micrograph of yittria stabilized zirconia splats. In FIG. 6, alumina splats are shown.

Figure 7:
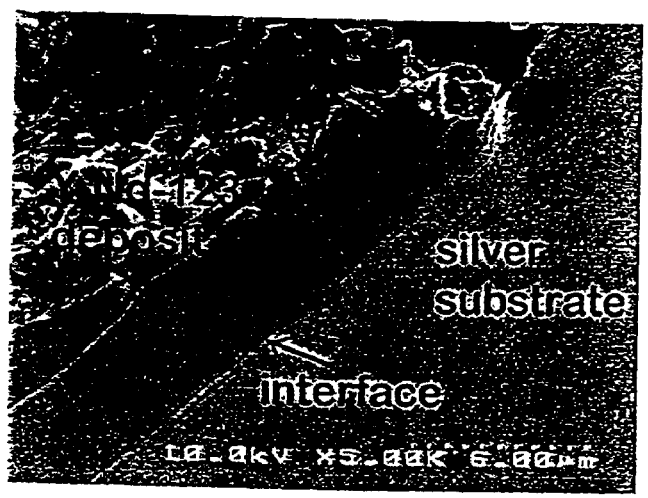
FIG. 7 is an SEM micrograph showing material displaced in a razor scratch test, demonstrating that Y, Nd-123 forms a good bond with the silver substrate.

The bonding of a Y, Nd-123 deposit on a silver substrate was examined using a straight razor to scratch the deposit. A micrograph of the razor scratch groove is shown in FIG. 7. This material appears to form a well-bonded interface with the silver substrate.

FIGS. 15(a) and 15(b) illustrate deposition in accordance with the method of this invention of the high temperature superconductor $Y_{0.3}Nd_{0.7}Ba_2Cu_3O_{7-x}$ which has a lower melting temperature and better absorptivity than alumina. The deposit shown in FIG. 15(a) was 2 mm below the laser beam whereas the deposit in FIG. 15(b) was 8 mm below. The velocities were 7 $ms^{-1}$ and 9 $ms^{-1}$, respectively.

Thus, although there have been described particular embodiments of the present invention of a new and useful Method and System for Thick-Film Deposition of Ceramic Materials, it is not intended that such references be construed as limitations upon the scope of this invention except as set forth in the following claims.

What is claimed is:

1. A method of depositing a ceramic film on a substrate comprising the steps of:
   a. directing a powder stream through a heating zone, said powder stream comprising a moving stream of suspended ceramic particles;
   b. directing a directed photonic radiation source at the suspended ceramic particles as they move through the heating zone so to heat the particles to a molten state thereby creating liquid phase ceramic droplets that are suspended in the moving stream, said directed photonic source providing the majority of heating of the suspended ceramic particles while within the heating zone wherein the directed photonic source is generally not directed towards the substrate and the substrate is generally not heated by the directed photonic source; and
   c. cooling the droplets to an undercooled state before impact with the substrate.

2. The method claim 1 wherein the step of heating said suspended ceramic particles further comprises heating the ceramic particles, to a temperature that is immediately below a vaporization threshold temperature.

3. The method of claim 1 wherein the ceramic particles have a diameter in the range of 30–50 microns.

4. The method of claim 1 wherein the directed photonic radiation source comprises a directed optical radiation source.

5. The method of claim 1 further comprising the step of heating the substrate before impact by the particles.

6. The method of claim 5 wherein the substrate is heated to a temperature of approximately 700 degrees Celsius.

7. The method of claim 1 further comprising the step of pre-heating the ceramic particles in the heating zone before exposing the particles to the radiation.

8. The method of claim 7 wherein the par bides are pre-heated using a diode pre-heater.

9. The method of claim 8 wherein the particles are pre-heated to a temperature of approximately 700 degrees Celsius.

10. The method of claim 1 further comprising the step of creating the powder stream by combining the ceramic particles with a gas stream.

11. The method of claim 10 further comprising controlling the gas stream to move at a velocity in the range of 8–20 meters/second.

12. The method of claim 10 wherein the ceramic particles are combined with the gas stream from a powder feeder operatively coupled to a gas flow tube.

13. The method of claim 12 wherein the powder stream is directed toward the heating zone by ejecting the powder stream from a nozzle connected to a distal end of the gas flow tube.

14. The method of claim 13 wherein the nozzle is configured to produce a laminar flow of the powder stream from the nozzle.

15. The method of claim 14 further comprising the step of constraining the shape of the powder stream from the nozzle by creating an annular gas co-flow proximate the powder stream.

16. The method of claim 1 wherein the undercooling step comprises moving the droplets in a transport gas through a radiation and convection cooling zone after the droplets leave the heating zone and before impact with the substrate.

17. The method of claim 16 wherein the undercooling step further comprises conductive cooling of the droplets upon impact with the substrate.

18. The method of claim 16 wherein the undercooling step is controlled to lower the temperature of the droplets to an undercooled temperature that is below an equilibrium melting temperature.

19. The method of claim 16 wherein the undercooling step is controlled to lower the temperature of the droplets to an undercooled temperature whereby solidification of the droplets on the substrate will bypass at least one high temperature oxide phase of the ceramic particles.

20. The method of claim 19 wherein the undercooling step is controlled by controlling a temperature of the transport gas.

21. The method of claim 20 wherein the directed optical radiation source comprises a laser.

22. The method of claim 19 wherein the undercooling step is controlled to lower the temperature of the droplets to an undercooled temperature whereby solidification of the droplets on the substrate to a Y-123 crystal structure phase will occur directly from the liquid phase.

23. The method of claim 22 wherein the undercooling step is controlled by controlling a temperature of the transport gas.

24. The method of claim 23 wherein the laser comprises a high flux laser.

25. The method of claim 19 wherein the undercooling step is controlled to lower the temperature of the droplets to an undercooled temperature whereby solidification of the droplets on the substrate will bypass the $Y_2O_3$ and 211 phases.

26. The method of claim 25 wherein the undercooling step is controlled by controlling a temperature of the transport gas.

27. The method of claim 26 wherein the high flux laser comprises a high flux laser having a focus zone disposed within the heating zone.

28. A method of forming a solid film of a ceramic material on a substrate comprising:
   a. feeding particles of the ceramic material into a gas flow tube containing a transport gas to form a moving particle stream;
   b. ejecting the particle stream from a nozzle into a heating zone, said heating zone comprising the focus zone of a of high flux optical radiation source;
   c. melting the ceramic particles in the heating zone to create liquid droplets of the ceramic material, wherein the high flux optical radiation source provides the majority of heating of the suspended ceramic particles while within the heating zone, and wherein the high flux optical radiation source is not directed towards the substrate and the substrate is not heated by the high flux optical radiation source;
d. cooling the liquid droplets to an undercooled state; and
e. depositing the droplets on the substrate.

29. The method of claim 28 further comprising the step of pre-heating the particle stream before exposing it to the optical radiation source.

30. The method of claim 28 wherein the ejecting step further comprises creating a laminar flow of the particle stream from the nozzle.

31. The method of claim 30 further comprising the step of constraining the particle stream after it leaves the nozzle by providing an annular co-flow of transport gas around the particle stream.

32. A method of forming a solid film of a ceramic material on a substrate comprising suspending a powder made of the ceramic material in a moving transport gas, melting the powder to form liquid droplets of the ceramic material, directing the droplets through a cooling region towards the substrate, and undercooling the droplets so that upon contact with the substrate the droplets solidify directly from a liquid phase to a 1:2:3 solid phase, wherein the suspended ceramic powder is melted by a directed photonic radiation source, said directed photonic source providing the majority of heating of the suspended ceramic powder, and wherein the directed photonic source is not directed towards the substrate and the substrate is not heated by the directed photonic source.

33. The method of claim 32 further comprising the step of pre-heating the transport gas.

34. The method of claim 33 wherein the transport gas is pre-heated to a temperature of approximately 300 degrees Celsius.

* * * * *